(12) United States Patent
Yamada

(10) Patent No.: US 7,060,994 B2
(45) Date of Patent: Jun. 13, 2006

(54) EXPOSURE APPARATUS AND METHOD

(75) Inventor: Akihiro Yamada, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/514,897

(22) PCT Filed: Jun. 17, 2003

(86) PCT No.: PCT/JP03/07699

§ 371 (c)(1),
(2), (4) Date: Nov. 17, 2004

(87) PCT Pub. No.: WO04/001820

PCT Pub. Date: Dec. 31, 2003

(65) Prior Publication Data

US 2005/0173653 A1    Aug. 11, 2005

(30) Foreign Application Priority Data

Jun. 19, 2002  (JP) ............................. 2002-178275

(51) Int. Cl.
*A61N 5/00* (2006.01)
*G21G 5/00* (2006.01)
*G03B 27/42* (2006.01)
*G03B 27/52* (2006.01)

(52) U.S. Cl. ............................. 250/492.2; 250/492.2; 355/53; 355/55

(58) Field of Classification Search ............. 250/492.2; 355/53, 55, 60, 66
See application file for complete search history.

(56) References Cited

U.S. PATENT DOCUMENTS 6,266,389 B1 *  7/2001  Murayama et al. ........... 378/34
6,406,820 B1 *  6/2002  Ota .............................. 430/30

FOREIGN PATENT DOCUMENTS

| JP | 9-63923 A | 3/1997 |
| JP | 9-153444 A | 6/1997 |
| JP | 11-186149 A | 7/1999 |
| JP | 11-219900 A | 8/1999 |
| JP | 2000-91209 A | 3/2000 |
| JP | 2000-286189 A | 10/2000 |

OTHER PUBLICATIONS

International Searching Authority; Japanese Patent Office; "PCT International Search Report"; corresponding to International Application No. PCT/JP03/07699; date of mailing Sep. 30, 2003; (1 page).

* cited by examiner

*Primary Examiner*—John R. Lee
*Assistant Examiner*—Jennifer Yantorno
(74) *Attorney, Agent, or Firm*—Morgan & Finnegan, LLP (57) ABSTRACT

An exposure apparatus includes a projection optical element that includes at least one reflection element and projects light from a reticle that forms a pattern onto an object, and a drive part that moves at least one of the reticle and the reflection element.

7 Claims, 5 Drawing Sheets

EXPOSURE APPARATUS AND METHOD

This application claims a benefit of priority based on Japanese Patent Application No. 2002-178275, filed on Jun. 19, 2002, which is hereby incorporated by reference herein in its entirety as if fully set forth herein.

TECHNICAL FIELD

The present invention relates to exposure apparatuses and methods to expose an object, such as a single crystal substrate for a semiconductor wafer, and a glass plate for a liquid crystal display ("LCD"). The present invention is especially suitable for an exposure apparatus and method that use ultraviolet light and extreme ultraviolet light as an exposure light source for exposure.

BACKGROUND ART

Along with recent demands for smaller and lower profile electronic devices, finer semiconductor devices to be mounted onto these electronic devices have been increasingly demanded. For example, the design rule for mask patterns has required that an image with a size of a line and space ("L & S") of less than 0.1 μm be extensively formed and it is expected to require circuit patterns of less than 80 nm in the near future. The L & S denotes an image projected onto a wafer in exposure with equal line and space widths, and serves as an index of exposure resolution. The exposure has three important factors including resolution, overlay accuracy, and throughput. The resolution is the minimum size for a precise pattern transfer. The overlay accuracy is a precision with which to overlay multiple patterns over an object to be exposed. The throughput is the number of sheets exposed per unit of time.

A projection exposure apparatus as a typical exposure apparatus for manufacturing semiconductor devices includes a projection optical system for exposing a pattern formed on a mask (reticle) onto a wafer, and its resolution R is given by Rayleigh's equation below:

$$R = k_1(\lambda/NA) \qquad (1)$$

where $\lambda$ is a wavelength of a light source, NA is a numerical aperture of the projection optical system, $k_1$ is a constant determined by a development process and others.

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

An exposure apparatus using the EUV as a light source (referred to as an "EUV exposure apparatus" hereinafter) is used for exposure of a circuit pattern of 100 nm or less, and the permissible overlay error is strict in the exposure process for such a fine pattern. Therefore, the overlay accuracy should be higher than the conventional one and reduces the overlay error caused by such a deformed optical element as a mirror due to environmental changes, such as varying temperature, and exposure heat. For example, Japanese Patent Application Publication No. 11-219900 proposes an exposure apparatus and method that improves the overlay accuracy through driving control of a reticle in the optical-axis direction, and corrects an exposure transfer magnification and positional offsets.

The driving control of the reticle proposed by Japanese Patent Application Publication No. 11-219900 may correct the transfer magnification only in a longitudinal direction of a slit or a direction orthogonal to a scan direction, and thus cannot always provide the EUV exposure apparatus with satisfactory overlay accuracy. In addition, unavailable independent corrections of positional offsets in the longitudinal and lateral (or scan) directions of the slit are insufficient to improve the overlay accuracy.

DISCLOSURE OF INVENTION

Accordingly, it is an exemplary object of the present invention to provide an exposure method and apparatus that may achieve intended overlay accuracy for the exposure apparatus that uses EUV light as a light source.

An exposure apparatus of one aspect of the present invention includes a projection optical element that includes at least one reflection element, and projects light from a reticle that forms a pattern onto an object, and a drive part that moves at least one of the reticle and the reflection element. The drive part may move the reticle and the reflection element in an optical-axis direction of the projection optical system. The drive part may move the reflection element in a direction that intersects the optical-axis direction. The light may be extreme ultraviolet light, and the exposure apparatus may further include an illumination system for illuminating the reticle using the extreme ultraviolet light. A transfer magnification of a projected image onto the object by the projection optical element and/or distortion of the projection optical element may be adjusted by substantially driving at least one of the reflection elements in an optical-axis direction or a direction substantially perpendicular to the optical-axis direction of the projection optical element.

An exposure apparatus of another aspect of the present invention includes a projection optical element that includes at least four reflection elements, and projects light from a reticle that forms a pattern onto an object, and a drive part that moves the reticle and at least one of the reflection elements in an optical-axis direction of the projection optical element. The drive part may move the reflection element in a direction that intersects the optical-axis direction. The light may be extreme ultraviolet light, and the exposure apparatus may further comprise an illumination system for illuminating the reticle using the extreme ultraviolet light.

An exposure apparatus of still another aspect of the present invention includes a projection optical system that includes at least one reflection element, and projects light from a reticle that forms a pattern onto an object, and a drive part that moves at least one reflection element in an optical-axis direction of the projection optical system and a direction that intersects the optical-axis direction.

An exposure apparatus of still another aspect of the present invention includes a projection optical system that includes plural optical units which have one or more reflection elements and are operable to drive in a predetermined direction, the projection optical system projecting light onto an object from a reticle that forms a pattern and is operable to drive in an optical-axis direction, a drive part for driving the reticle and the optical unit, and a control part for controlling the drive part based on a position on the object at which the pattern is to be formed. The predetermined direction may be the optical-axis direction or a direction perpendicular to the optical-axis direction. The light may be extreme ultraviolet light having a wavelength of 20 nm or less.

An exposure method for exposing a pattern formed on a reticle that may drive in an optical-axis direction, through a projection optical system that includes plural optical units that have one or more reflection elements and is operable to drive in a predetermined direction includes the steps of obtaining position information indicative of a position on the object at which the pattern is to be formed, and generating correction information necessary to form the pattern on the position on the object, based on the position information obtained in the obtaining step; and driving the reticle and the optical unit based on correction information generated in the generating step. The driving step drives the optical unit that separates a principal ray for forming the pattern.

A device fabricating method of another aspect of the present invention includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

A projection optical system of another aspect of the present invention for imaging extreme ultraviolet light from an object surface onto an image surface includes plural optical units which have one or more reflection elements and are operable to drive in an optical-axis direction. A projection optical system of another aspect of the present invention for imaging extreme ultraviolet light from an object surface onto an image surface includes plural optical units which have one or more reflection elements and are operable to drive in a direction perpendicular to an optical-axis direction.

Other objects and further features of the present invention will become readily apparent from the following description of the embodiments with reference to accompanying drawings.

BEST MODE FOR CARRYING OUT THE INVENTION

A description will now be given of an exposure apparatus and method of one embodiment according to the present invention with reference to the accompanying drawings. The present invention is not limited to these embodiments and each element is replaceable within a scope that achieves the objects of the present invention. For example, while the exposure apparatus 100 of the present invention uses the EUV light as an exposure light source, it may use such laser as KrF excimer laser, ArF excimer laser, or $F_2$ laser. The same reference numeral in each figure denotes the same element, and a description thereof will be omitted.

Figure 1:
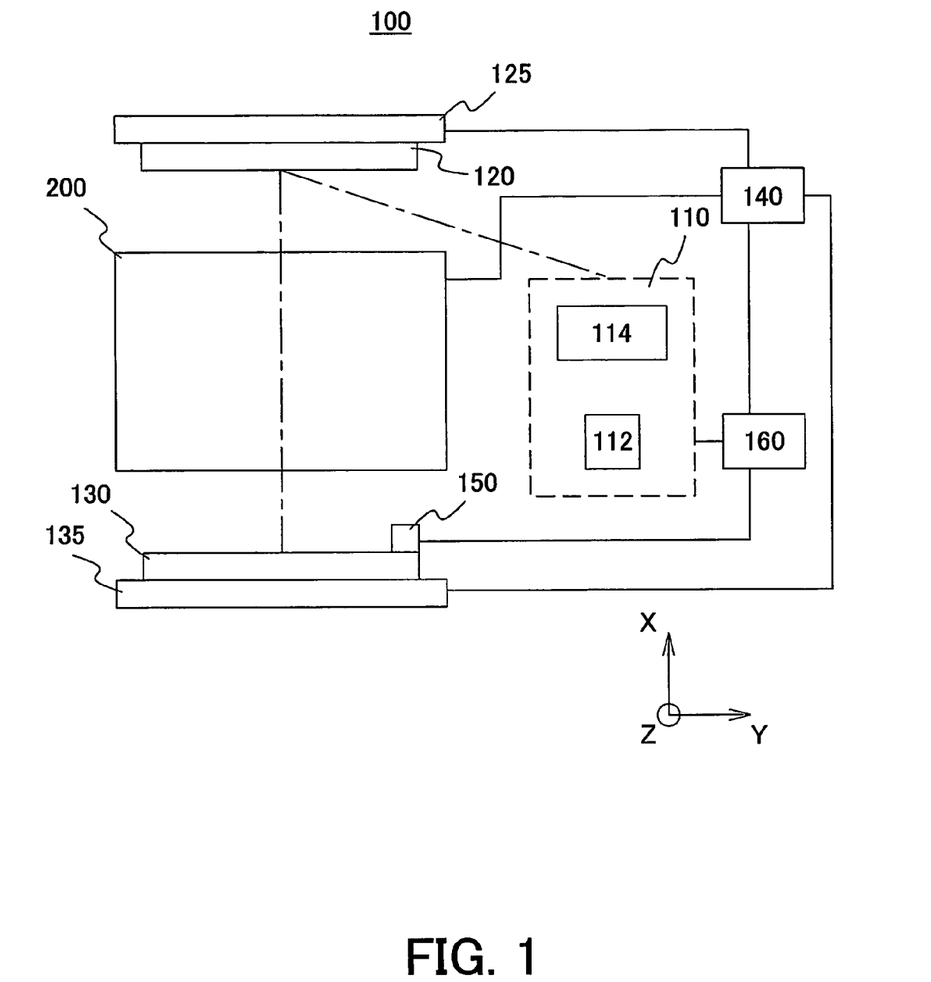
FIG. 1 is a schematic structural view of an exposure apparatus of one embodiment according to the present invention.

Here, FIG. 1 is a schematic structural view of the exposure apparatus 100. As shown in FIG. 1, the exposure apparatus includes an illumination apparatus 110, a reticle stage 125 mounted with a reticle (mask or pattern surface) 120 so that the reticle stage 125 may drive the reticle 120, a projection optical system 200, a plate stage 135 mounted with a plate 130 as an object to be exposed so that the plate stage 135 may drive the plate 130, and a drive part 140, a detector part, and a control part 160.

The exposure apparatus 100 is a projection exposure apparatus that uses, as exposure illumination light, an EUV ray (e.g., with a wavelength of 13.4 nm) for step-and-scan or step-and-repeat exposure of a circuit pattern formed on the reticle 120 onto a plate 130. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer. At least the optical path through which the EUV light travels should preferably be maintained in a vacuum atmosphere, although not shown in FIG. 1, since the EUV light has low transmittance for air.

The illumination apparatus 110 uses the EUV light less than 20 nm (with a wavelength of, for example, 13.4 nm) to illuminate the reticle 120 that forms a circuit pattern to be transferred, and includes a light source section 112 and an illumination optical system 114.

The light source section 112 uses, for example, a 25 laser plasma light source. The laser plasma light source irradiates a highly intensified pulse laser beam to a target material put in vacuum, thus generating high-temperature plasma for use as EUV light with a wavelength of about 13.4 nm emitted from this. The target material may use a metallic thin film, inert gas, and droplets, etc. The pulse laser preferably has high repetitive frequency, e.g., usually several kHz, for increased average intensity of the emitted EUV light. Alternatively, the EUV light source 112 may use a discharge plasma light source, which emits gas around an electrode put in vacuum, applies pulse voltage to the electrode for discharge, and induces high-temperature plasma. This plasma emits the EUV light, for example, with a wavelength of about 13.4 nm to be utilized. Of course, the EUV light source 112 is not limited to them, but may use any technology known in the art.

The illumination optical system 114 propagates the EUV light, illuminates the reticle 120, and includes a condenser optical system, an optical integrator, an aperture stop, a blade, etc. For example, the condenser optical system includes one or more mirrors for condensing EUV light that is radiated approximately isotropically from the EUV light source 112, and the optical integrator uniformly illuminates the reticle 120 with a predetermined aperture.

A debris eliminator (not shown) is preferably arranged between the EUV light source 112 and the illumination optical system 114 to eliminate debris generated concurrently when the EUV light is produced.

The reticle 120 is a reflection type reticle that includes a multilayer film for reflecting the EUV light, or a transmission type reticle (for example, molded reticle) and forms a circuit pattern (or image) to be transferred. It is supported and driven by a reticle stage 125. The reticle 120 is adopted drive in a scan direction and an optical-axis direction (or direction X). Therefore, the exposure transfer magnification may be corrected by controlling driving of the reticle 120 in the optical-axis direction.

The diffracted light emitted from the reticle 120 is projected onto the plate 130 after reflected by the projection optical system 200. The reticle 120 and plate 130 are arranged optically conjugate with each other. Since the exposure apparatus 100 is a scanner, the reticle 120 and plate 130 are scanned to transfer a reduced size of a pattern on the reticle 220 onto the plate 230.

The reticle stage 125 supports the reticle 120, and is connected to the drive part 140, which will be described later. The reticle stage 125 may use any structure known in the art, and a detailed structure and operation thereof will be omitted.

Figure 2:
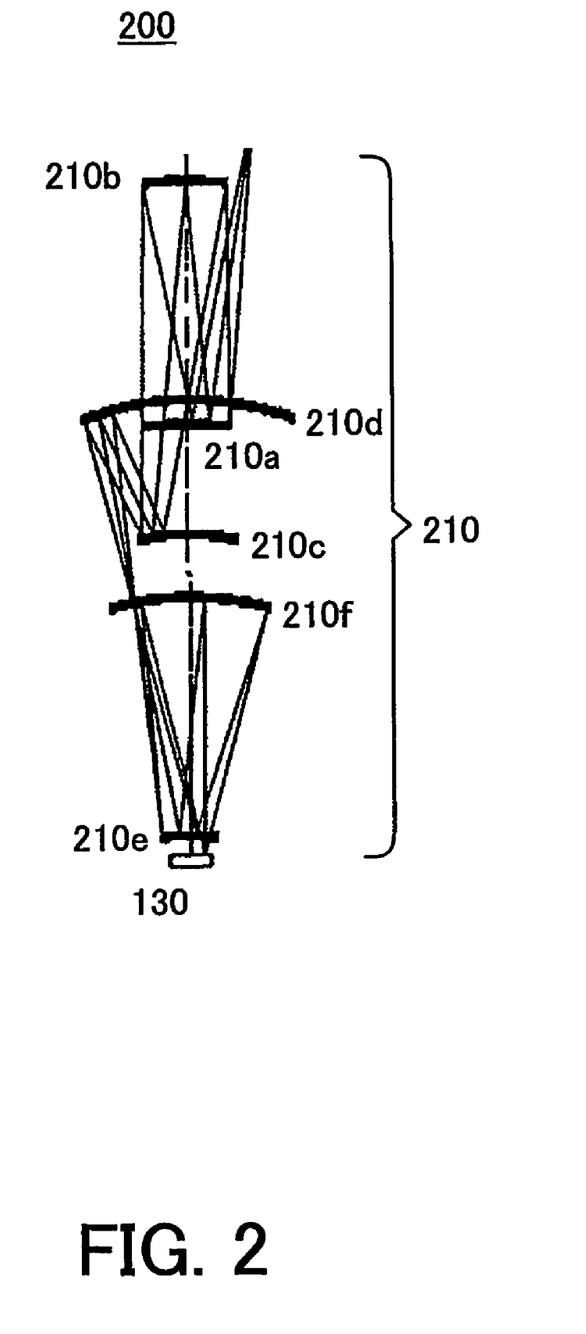
FIG. 2 is a schematic sectional view of a projection optical system shown in FIG. 1.

The projection optical system 200 is a cataoptric projection optical system that images light from an object surface, such as the reticle 120, onto an image surface, such as an object to be exposed as the plate 130. The projection optical system 200 in the instant embodiment includes, as shown in FIG. 2, six mirrors 210, i.e., 210a–210f, in order of reflecting light from the reticle 120 side. Here, FIG. 2 is a schematic sectional view of the projection optical system 200.

The reflection element 210 images light using reflection(s). The reflection element 210 is made of a mirror that applies a multilayer film for reflecting the EUV light, and for serving to enhance the EUV light. A multilayer applicable to the reflection element 210 includes, for example, a Mo/Si multilayer film including alternately laminated molybdenum (Mo) and silicon (Si) layers on a reflection surface or a Mo/Be multilayer film including alternately laminating molybdenum (Mo) and beryllium (Be) layers on the reflection surface. The reflection element 210 including the Mo/Si multilayer film may obtain reflectance of 67.5% for a wavelength range near a wavelength of 13.4 nm, and the reflection element 210 including the Mo/Be multilayer film may obtain reflectance of 70.2% for a wavelength range near a wavelength of 11.3 nm. Of course, the present invention does not limit the multilayer film applicable to the reflection element 210 to the above materials, and may use any multilayer film that has an operation or effect similar to that of the above.

The projection optical system 200 is connected to the drive part 140, and allows a first reflection element 210a in order for reflecting light from the reticle side among the reflection elements 210 to drive in a predetermined direction. The predetermined direction is the optical-axis direction or direction X and/or a decenter direction perpendicular to the optical axis or direction Y. The reflection element 210a is driven in the optical-axis direction or direction X and/or the decenter direction or direction Y. The transfer magnification and distortion of the circuit pattern to be formed on the plate 130 may be corrected by driving the reflection element 210a in the optical-axis direction or direction X and the distortion and position offset of the circuit pattern to be formed on the plate 130 may be corrected by driving the reflection element 210a in the decenter direction or direction Y. The transfer magnification, distortion and/or position offset of the circuit pattern to be formed on the plate 130 may be corrected by driving the reflection element 210a in the optical-axis direction or direction X and decenter direction or direction Y simultaneously. The predetermined direction is an optical-axis direction and/or a direction perpendicular to the optical axis, but may be the optical-axis direction and a direction that intersects the optical axis. A direction to drive the reflection element is not limited to the optical-axis direction and/or the direction that intersects or is orthogonal to the optical axis, and may be a rotational direction around to an optical axis or an axis perpendicular to the optical axis. Of course, the driven reflection element is not limited to the first reflection element but may be second and other reflection elements.

Thus, the projection optical system 200 allows the reflection element 210a to drive in the optical-axis direction or direction X and decenter direction or direction Y, reduces the overlay error, and realizes the intended overlay accuracy required for the EUV exposure apparatus. The overlay accuracy may further improve when driving of the reflection element 210a is properly combined with driving of the reticle 120 in the optical-axis direction or direction X.

The projection optical system 200 shown in FIG. 2 represents a typical projection optical system for description convenience, the present invention does not limit the structure of the projection optical system to this structure. For example, the number of reflection elements may be any other than six, for example eight, and the optical unit includes one or more reflection elements and is operable to drive in the predetermined direction or the optical-axis direction and the direction perpendicular to the optical-axis direction.

In various projection optical systems, the reflection element to be driven for improvement of the overlay accuracy may be a reflection element (which is the first reflection element 210a from the reticle side in the embodiment shown in FIG. 2) between a pupil (where the optical axis intersects the principal ray) and the reticle, the reflection element (which is the third reflection element 210c from the reticle side in the embodiment shown in FIG. 2) between an intermediate image and the pupil and near the intermediate image, the reflection element (closer to the reticle surface, intermediate surface, or plate surface than the pupil) that separates the principal ray, and the reflection element (which is the sixth reflection element 210e from the reticle side in the embodiment shown in FIG. 2) near the imaging surface or plate.

Turning back to FIG. 1, the plate 130 is an exemplary object to be exposed, such as a wafer and a LCD, and photoresist is applied to the plate 130. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The plate stage 135 supports the plate 130 and is connected to the drive part 140, which will be described later. The plate stage 135 may use any structure known in the art, and thus a detailed description of its structure and operations will be omitted. For example, the plate stage 135 is installed on a stage stool supported on the floor and the like, for example, via a dumper, and the reticle stage 125 and the projection optical system 200 are installed on a lens barrel stool (not shown) supported, for example, via a dumper to the base frame placed on the floor.

The drive part 140 is connected to the reticle stage 125, projection optical system 200, plate stage 135, and control part 160, which will be described later. The drive part 140 is made, for example, of a linear motor, and drives the reticle stage 125 under control by the control part 160 to move the reticle 120 in the scan direction and the optical-axis direction or direction X. The drive part 140 is controlled by the control part 160, and drives the projection optical system 200, more specifically, the reflection element 210a in the optical-axis direction or direction X and decenter direction or direction Y. The drive part 140 drives the plate stage 135, and moves the plate 130 in the directions XYZ. While the drive part 140 of the instant embodiment drives the reticle stage 125, projection optical system 200, and plate stage 135, a moving mechanism may be provided for each of them. The reticle 120 and the plate 130 are controlled by the control part 160 and synchronously scanned.

The detector part 150 includes, for example, an alignment detection mechanism for measuring an arrangement between a position of the reticle 120 and an optical axis of the projection optical system 200, and an arrangement between a position of the plate 130 and the optical axis of the projection optical system 200, and a focus position detection mechanism for detecting a focus position of the plate 130 surface, thereby detecting a position on the plate 130 at which the circuit pattern is formed or light from the projection optical system 200 images. The detector 150 is connected to the control part 160, and sends to the control part 160 information on the detected position on the plate 130, at which the circuit pattern is formed.

The control part 160 is electrically connected to the illumination apparatus 110, the drive part 140, and the detector part 150. The control part 160 generates correction information based on the position information on the plate 130 to form the circuit pattern, which is sent from the detector part 150, and controls the drive part 140. The correction information indicates a drive amount of the reticle 120 in the optical-axis direction or direction X as well as drive amount of the optical-axis direction or direction X and decenter direction or direction Y of the reflection element 210a in the projection optical system 200. The control part 160 includes a CPU and a memory (not shown), and controls actions of the exposure apparatus 100. The CPU includes any processor irrespective of its name, such as an MPU, and controls actions of each part. The memory includes a ROM and a RAM to store a firmware used for operations of the exposure apparatus 100.

In exposure, the EUV light emitted from the illumination apparatus 110 illuminates the reticle 120. The EUV light that reflects the circuit pattern on the reticle 120 is imaged on the plate 130 by the projection optical system 100. The instant embodiment scans the reticle 120 and plate 130 at a speed ratio of a reduction ratio to expose the entire surface of the reticle 120.

Figure 3:
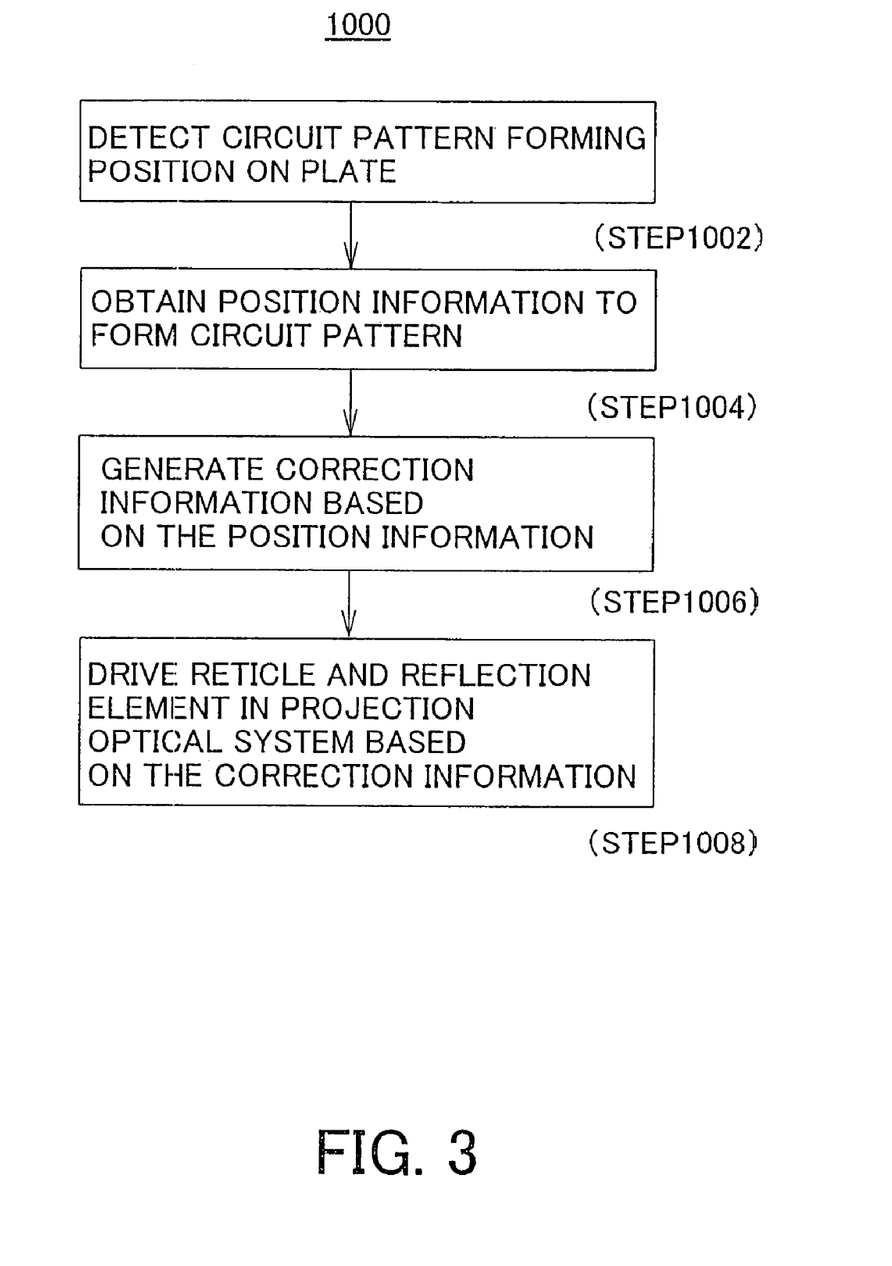
FIG. 3 is a flowchart for explaining an exposure apparatus of one embodiment according to the present invention.

A description will be given of the inventive, exemplary exposure method using this exposure apparatus 100 with reference to FIG. 3. FIG. 3 is a flowchart of the exposure method 1000 of one embodiment according to the present invention.

When the exposure apparatus 100 starts exposure, the detector part 150 detects a position on the plate 130 that forms the circuit pattern or images the light from the projection optical system 200 (step 1002). The result detected by the detector part 150 is sent to the control part 160, and the control part 160 obtains position information indicative of the position on the plate 130 that forms the circuit pattern (step 1004). The control part 160, in turn, generates correction information based on the position information obtained in the step 1004 to form the circuit pattern on the desired position on the plate, which correction information represents the drive amount of the reticle 120 in the optical-axis direction or direction X as well as drive amount of the optical-axis direction or direction X and decenter direction or direction Y of the reflection element 210a in the projection optical system 200 (step 1006). The control part 160 controls the drive part 140 based on the generated correction information, and the drive part 140 drives the reticle 120 and the reflection element 210a in the projection optical system 200 in accordance with the correction information (step 1008). The exposure follows using the reticle 120 and projection optical system 200 that have been driven in accordance with the correction information. This exposure method may correct the transfer magnification, distortion, and positional offset and reduce the overlay error, by properly driving the reticle 120 and reflection element 210 in the projection optical system 200 or optical unit.

Figure 4:
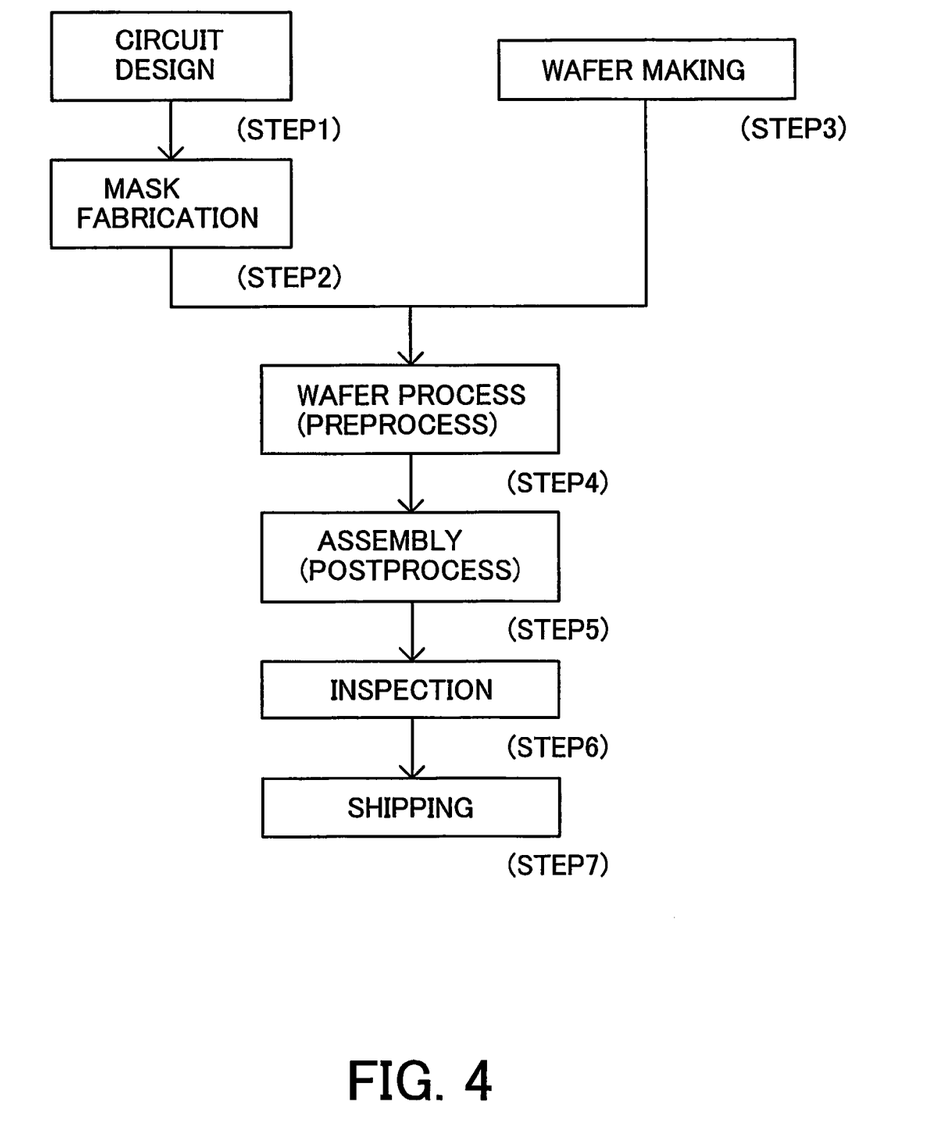
FIG. 4 is a flowchart for explaining how to fabricate devices (such as semiconductor chips such as ICs and LCDs, CCDs, and the like).
Figure 5:
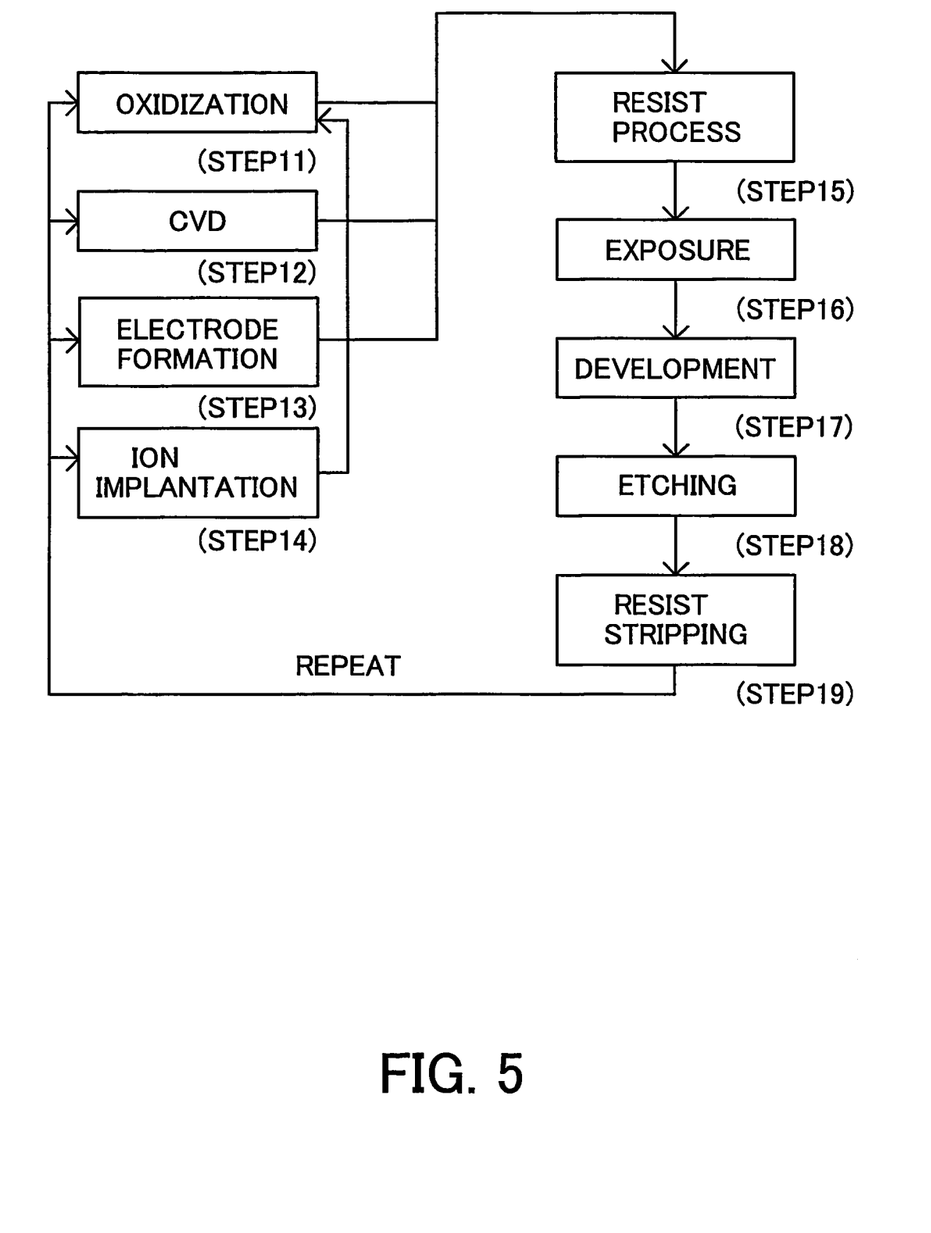
FIG. 5 is a detail flowchart of a wafer process as Step 4 shown in FIG. 4.

Referring now to FIGS. 4 and 5, a description will be given of an embodiment of a device fabricating method using the above exposure apparatus. FIG. 4 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4 in FIG. 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of the instant embodiment achieves the intended overlay accuracy and fabricates higher quality devices than conventional. Thus, the device fabrication method using this exposure apparatus 100 and resultant devices serve as one aspect of the present invention.

Further, the present invention is not limited to these preferred embodiments, and various modifications and changes may be made in the present invention without departing from the spirit and scope thereof. For example, the number of reflection elements in the projection optical system of the instant embodiment is not limited to six, and a step-and-repeat exposure apparatus (referred to as a "stepper") is also usable.

INDUSTRIAL APPLICABLITY

The inventive projection optical system may improve the overlay accuracy by correcting two of the transfer magnification, the distortion, and the positional offset by properly driving only the reflection element or both the reticle and the reflection element with appropriate components. Therefore, the exposure apparatus that includes the projection optical system may provide higher quality devices with good exposure performance.

The invention claimed is:

1. An exposure apparatus comprising:
a projection optical system that includes at least four reflection elements, projects a pattern of a reticle onto an object, and forms an intermediate image of the pattern; and
a drive part that drives at least one of the reflection elements disposed between the intermediate image and a pupil of the projection optical system and near the intermediate image in an optical-axis direction of said projection optical system.

2. An exposure apparatus according to claim 1, wherein said drive part drives the reflection element in a direction that intersects the optical-axis direction.

3. An exposure apparatus according to claim 1, further comprising an illumination system for illuminating the reticle using extreme ultraviolet light.

4. An exposure apparatus according to claim 1, wherein said drive part moves the reticle.

5. A device fabricating method comprising the steps of:
exposing an object using an exposure apparatus; and
performing a predetermined process for the exposed object,
wherein an exposure apparatus includes a projection optical system that includes at least four reflection elements, projects a pattern of a reticle onto an object, and forms an intermediate image of the pattern, and a drive part that drives at least one of the reflection elements disposed between the intermediate image and a pupil of the projection optical system and near the intermediate image in an optical-axis direction of said projection optical system.

6. An exposure apparatus according to claim 1, wherein a transfer magnification of a projected image onto the object by the projection optical system and distortion of the projection optical system are adjusted by substantially driving the at least one of the reflection elements.

7. An exposure apparatus according to claim 4, wherein a transfer magnification of a projected image onto the object by the projection optical system and distortion of the projection optical system are adjusted by substantially driving the reticle and the reflection element.

* * * * *